(12) United States Patent
Baade et al.

(10) Patent No.: US 9,564,560 B2
(45) Date of Patent: *Feb. 7, 2017

(54) OPTOELECTRONIC COMPONENT

(71) Applicant: OSRAM Opto Semiconductors GmbH, Regensburg (DE)

(72) Inventors: Torsten Baade, Regensburg (DE); Kristin Große, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/980,027

(22) Filed: Dec. 28, 2015

(65) Prior Publication Data

US 2016/0149092 A1 May 26, 2016

Related U.S. Application Data

(63) Continuation of application No. 13/809,036, filed as application No. PCT/EP2011/061589 on Jul. 8, 2011, now Pat. No. 9,269,866.

(51) Int. Cl.
*H01L 33/50* (2010.01)
*H01L 33/56* (2010.01)
(Continued)

(52) U.S. Cl.
CPC ......... *H01L 33/502* (2013.01); *C09K 11/0883* (2013.01); *C09K 11/7731* (2013.01);
(Continued)

(58) Field of Classification Search
CPC ......... H01L 33/56; H01L 33/502; H01L 33/26
See application file for complete search history.

(56) References Cited

U.S. PATENT DOCUMENTS 8,471,277 B2 * 6/2013 Mitsuishi ........... C09K 11/0883
257/89
9,269,866 B2 * 2/2016 Baade ................ C09K 11/0883
(Continued)

FOREIGN PATENT DOCUMENTS

CN 1432198 A 7/2003
CN 101253637 A 8/2008
(Continued)

OTHER PUBLICATIONS

Young Rag Do et al., "Luminescence Properties of Potential $Sr_{1-x}Ca_xGa_2S_4$:Eu Green- and Greenish-Yellow-Emitting Phosphors for White LED," Journal of the Electrochemical Society, vol. 153, No. 7, Jan. 1, 2006, pp. H142-H146 (ABSTRACT).
(Continued)

*Primary Examiner* — Alonzo Chambliss
(74) *Attorney, Agent, or Firm* — DLA Piper LLP (US)

(57) ABSTRACT

An optoelectronic component includes a semiconductor chip that emits a primary radiation in the short-wave blue spectral range at a dominant wavelength of less than approximately 465 nm; and a phosphor that converts at least part of the primary radiation into a longer-wave secondary radiation in the green spectral range at a dominant wavelength of between approximately 490 nm and approximately 550 nm and at least partly surrounds the semiconductor chip, wherein a mixed light composed of primary radiation and secondary radiation has a dominant wavelength at wavelengths of approximately 460 nm to approximately 480 nm such that a luminous flux of the mixed light is up to 130% greater than a luminous flux in an optoelectronic component without a phosphor having the same dominant wavelength in a range of 460 nm to 480 nm, and the phosphor is arranged in a lamina that bears directly on the semiconductor chip.

17 Claims, 11 Drawing Sheets

(51) Int. Cl.
*C09K 11/08* (2006.01)
*C09K 11/77* (2006.01)
*H01L 33/26* (2010.01)

(52) U.S. Cl.
CPC .......... *C09K 11/7734* (2013.01); *H01L 33/26* (2013.01); *H01L 33/50* (2013.01); *H01L 33/56* (2013.01); *H01L 2224/48091* (2013.01); *H01L 2224/73265* (2013.01)

(56) References Cited

U.S. PATENT DOCUMENTS

| | | |
|---|---|---|
| 2009/0021926 A1 | 1/2009 | Wang et al. |
| 2009/0050907 A1 | 2/2009 | Yuan et al. |
| 2009/0152576 A1 | 6/2009 | Naum et al. |
| 2010/0079058 A1 | 4/2010 | Schmidt et al. |
| 2010/0164365 A1 | 7/2010 | Yoshino et al. |

FOREIGN PATENT DOCUMENTS

| | | |
|---|---|---|
| CN | 101379164 A | 3/2009 |
| DE | 100 36 940 A1 | 2/2002 |
| DE | 10 026 435 A1 | 4/2002 |
| DE | 103 16 769 A1 | 10/2004 |
| DE | 10 2004 038 199 A1 | 3/2006 |
| DE | 10 2006 015 788 A1 | 9/2007 |
| DE | 10 2007 020 782 A1 | 4/2008 |
| DE | 10 2007 022 947 A1 | 10/2008 |
| WO | 2005/081319 A1 | 9/2005 |

OTHER PUBLICATIONS

European Committee for Standarisation, "European Standard EN 12966-1," European Committee for Standarisation (CEN), Mar. 2007, pp. 1-74.

English translation of Chinese Examination Report dated Mar. 24, 2014 from corresponding Chinese Patent Application No. 201180034421.0.

English translation of Japanese Notification of Reasons for Refusal from corresponding Japanese Patent Application No. 2013-519041.

* cited by examiner

| Dominant Wavelength | Peak Wavelength | Phosphor Concentration | Cx | Cy | Luminous Flux | Radiation power | Luminous flux ratio (normalized to 470 nm) | Radiation power ratio (normalized to 470 nm) |
|---|---|---|---|---|---|---|---|---|
| 475 | 473.4 | - | 0.1189 | 0.0967 | 6.30 | 69.00 | 122 % | 95 % |
| 470 | 467.8 | - | 0.1298 | 0.0664 | 5.18 | 72.33 | 100 % | 100 % |
| 465 | 462.2 | - | 0.1388 | 0.0466 | 4.22 | 75.67 | 81 % | 105 % |
| 455 | 450.9 | - | 0.1524 | 0.0248 | 2.73 | 82.33 | 53 % | 114 % |
| 445 | 439.7 | - | 0.1613 | 0.0144 | 1.65 | 89.00 | 32 % | 123 % |
| 440 | 434.1 | - | 0.1643 | 0.0114 | 1.23 | 92.33 | 24 % | 128 % |

FIG 2B

| Dominant Wavelength | Peak Wavelength | Phosphor Concentration | Cx | Cy | Luminous Flux | Radiation power | Luminous flux ratio (normalized to 470 nm) | Radiation power ratio (normalized to 470 nm) |
|---|---|---|---|---|---|---|---|---|
| 455 | 450.9 | 1.5 % | 0.1572 | 0.1127 | 8.61 | 66.59 | 166 % | 91 % |
| 450 | 445.3 | 1.5 % | 0.1623 | 0.1136 | 8.84 | 66.78 | 171 % | 92 % |
| 445 | 439.7 | 1.5 % | 0.1665 | 0.1185 | 9.07 | 68.12 | 175 % | 94 % |
| 440 | 434.1 | 1.5 % | 0.1699 | 0.1289 | 9.30 | 69.57 | 180 % | 96 % |

FIG 3B

| Semiconductor chip | | | | Optoelectronic component | | | | | | Luminous flux ratio |
|---|---|---|---|---|---|---|---|---|---|---|
| Dominant wavelength Semiconductor chip | cx | cy | Phosphor concentration | Dominant wavelength Optoelectronic component | cx | cy | Luminous flux | Radiation power | | |
| 465,5 | 0,1399 | 0,0493 | 0,0 % | 465,5 | 0,1411 | 0,0504 | 22,8 | 378 | | 100 % |
| 441 | 0,1656 | 0,0148 | 0,0 % | 441,5 | 0,1662 | 0,0167 | 8,6 | 447 | | 38 % |
|  |  |  | 1,0 % | 462,4 | 0,1692 | 0,0794 | 34,3 | 400 | | 150 % |
|  |  |  | 1,5 % | 466,7 | 0,1704 | 0,0999 | 40,4 | 385 | | 177 % |
|  |  |  | 2,0 % | 470,1 | 0,1712 | 0,1203 | 46,3 | 371 | | 203 % |
| 451 | 0,1578 | 0,0224 | 0,0 % | 451,1 | 0,1585 | 0,0239 | 13,3 | 418 | | 58 % |
|  |  |  | 1,0 % | 463,2 | 0,1612 | 0,0698 | 33,1 | 383 | | 145 % |
|  |  |  | 1,5 % | 467,1 | 0,1623 | 0,0904 | 39,9 | 368 | | 175 % |
|  |  |  | 2,0 % | 469,9 | 0,1632 | 0,1084 | 45 | 355 | | 197 % |
| 454 | 0,1545 | 0,026 | 0,0 % | 454,1 | 0,1554 | 0,0274 | 14,9 | 409 | | 65 % |
|  |  |  | 1,0 % | 464,4 | 0,158 | 0,0704 | 32,3 | 371 | | 142 % |
|  |  |  | 1,5 % | 467,5 | 0,1586 | 0,0875 | 38,1 | 361 | | 167 % |
|  |  |  | 2,0 % | 469,7 | 0,1598 | 0,1031 | 41,8 | 344 | | 183 % |

FIG 4B

OPTOELECTRONIC COMPONENT

RELATED APPLICATIONS

This is a continuation of U.S. application Ser. No. 13/809,036, filed Jan. 8, 2013, which is a §371 of International Application No. PCT/EP2011/061589, with an international filing date of Jul. 8, 2011 (WO 2012/007369 A1, published Jan. 19, 2012), which is based on German Patent Application No. 10 2010 031 237.1, filed Jul. 12, 2010, the subject matter of which is incorporated herein by reference.

TECHNICAL FIELD

This disclosure relates to an optoelectronic component comprising a semiconductor chip for emitting electromagnetic radiation and a phosphor for wavelength conversion.

BACKGROUND

Known optoelectronic components comprise semiconductor chips which emit electromagnetic radiation in the blue spectral range having a wavelength of less than approximately 480 nm. The semiconductor chips have to emit electromagnetic radiation having the longest possible wavelength to achieve high lumen values. This has the disadvantage that the radiation power of a semiconductor chip that emits in the blue spectral range decreases greatly as the wavelength increases.

It could therefore be helpful to provide an optoelectronic component which comprises semiconductor chips having a high radiation power and at the same time emits light in the long-wave blue spectral range.

SUMMARY

We provide an optoelectronic component including a semiconductor chip, and a phosphor at least partly surrounding the semiconductor chip, wherein 1) the semiconductor chip emits a primary radiation in a short-wave blue spectral range at a dominant wavelength of less than approximately 465 nm, and wherein the phosphor converts at least part of the primary radiation into a longer-wave secondary radiation in a green spectral range at a dominant wavelength of approximately 490 nm to approximately 550 nm, and 2) a mixed light composed of primary radiation and secondary radiation has a dominant wavelength at wavelengths of approximately 460 nm to approximately 480 nm such that luminous flux of the mixed light is up to 130% greater than luminous flux of an optoelectronic component without a phosphor having the same dominant wavelength of 460 nm to 480 nm.

We also provide an optoelectronic component including a semiconductor chip that emits a primary radiation in the short-wave blue spectral range at a dominant wavelength of less than approximately 465 nm; and a phosphor that converts at least part of the primary radiation into a longer-wave secondary radiation in the green spectral range at a dominant wavelength of between approximately 490 nm and approximately 550 nm and at least partly surrounds the semiconductor chip, wherein a mixed light composed of primary radiation and secondary radiation has a dominant wavelength at wavelengths of approximately 460 nm to approximately 480 nm such that a luminous flux of the mixed light is up to 130% greater than a luminous flux in an optoelectronic component without a phosphor having the same dominant wavelength in a range of 460 nm to 480 nm, and the phosphor is arranged in a lamina that bears directly on the semiconductor chip.

We further provide an optoelectronic component including a semiconductor chip that emits a primary radiation in the short-wave blue spectral range at a dominant wavelength of less than approximately 465 nm; and a phosphor that converts at least part of the primary radiation into a longer-wave secondary radiation in the green spectral range at a dominant wavelength of between approximately 490 nm and approximately 550 nm and at least partly surround the semiconductor chip, wherein a mixed light composed of primary radiation and secondary radiation has a dominant wavelength at wavelengths of approximately 460 nm to approximately 480 nm such that a luminous flux of the mixed light is up to 130% greater than a luminous flux in an optoelectronic component without a phosphor having the same dominant wavelength in a range of 460 nm to 480 nm, and the phosphor includes an electrophoretically deposited phosphor layer applied on a radiation exit area of the semiconductor chip, the phosphor layer having a thickness of 5 micrometers to 50 micrometers.

We further yet provide an optoelectronic component including a semiconductor chip that emits a primary radiation in the short-wave blue spectral range at a dominant wavelength of less than approximately 465 nm; and a phosphor that converts at least part of the primary radiation into a longer-wave secondary radiation in the green spectral range at a dominant wavelength of between approximately 490 nm and approximately 550 nm and at least partly surround the semiconductor chip, wherein a mixed light composed of primary radiation and secondary radiation has a dominant wavelength at wavelengths of approximately 460 nm to approximately 480 nm such that a luminous flux of the mixed light is up to 130% greater than a luminous flux in an optoelectronic component without a phosphor having the same dominant wavelength in a range of 460 nm to 480 nm, and the phosphor is arranged at and/or in an exit window terminating the optoelectronic component around the semiconductor chip.

BRIEF DESCRIPTION OF THE DRAWINGS

Various examples of our components are explained in greater detail below with reference to the drawings.

FIG. 2B shows in a tabular fashion a simulation of the brightness and of the color locus of the blue-emitting semiconductor chip from FIG. 2A.

FIG. 3B shows in a tabular fashion results of the simulation from FIG. 3A.

FIG. 4B shows in a tabular fashion measured values concerning FIG. 4A

LIST OF REFERENCE SIGNS

Figure 1A:
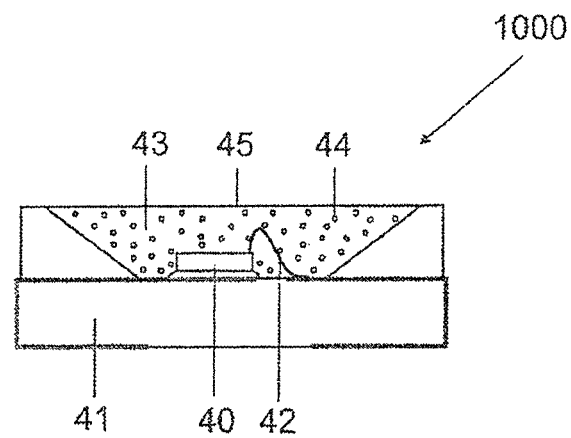
FIG. 1A shows an optoelectronic component with volume conversion.

1000 Optoelectronic component
1 Color loci of the semiconductor chips in the reference case
2 Area of the blue standard EN 129661 C1
3 Area of the blue standard EN 129661 C2
4 Rus Rail
5 Envelope of the color loci in the case of 1% phosphor
6 Color loci at chip wavelength of 441 nm, 1% phosphor
7 Color loci at chip wavelength of 451 nm, 1% phosphor
8 Color loci at chip wavelength of 454 nm, 1% phosphor
10 Color loci of the LEDs in accordance with the simulation
15 Envelope of the color loci in the case of 1.5% phosphor
16 Color loci at chip wavelength of 441 nm, 1.5% phosphor
17 Color loci at chip wavelength of 451 nm, 1.5% phosphor
18 Color loci at chip wavelength of 454 nm, 1.5% phosphor
25 Envelope of the color loci in the case of 2% phosphor
26 Color loci at chip wavelength of 441 nm, 2% phosphor
27 Color loci at chip wavelength of 451 nm, 2% phosphor
28 Color loci at chip wavelength of 454 nm, 2% phosphor
40 Semiconductor chip having emission wavelength in the blue spectral range
41 Carrier/leadframe
42 Bonding wire
43 Potting
44 Phosphor
45 Exit window
46 Projected dominant wavelength range
100 Excerpt from the color space in accordance with the CIE standard chromaticity system
101 Color locus for semiconductor chips at phosphor concentration of 1%
102 Color locus for semiconductor chips at phosphor concentration of 1.5%
103 Color locus for semiconductor chips at phosphor concentration of 2%
110 Color locus of a semiconductor chip having dominant wavelength of 441 nm
111 Color locus of a semiconductor chip having dominant wavelength of 451 nm
112 Color locus of a semiconductor chip having dominant wavelength of 454 nm
113 Color locus of a semiconductor chip having dominant wavelength of 465.5 nm

DETAILED DESCRIPTION

We provide optoelectronic components comprising a carrier and at least one semiconductor chip.

The semiconductor chip is at least partly surrounded by a phosphor. The semiconductor chip emits a primary radiation in the short-wave blue spectral range at a dominant wavelength of less than approximately 465 nm. The phosphor converts at least part of the primary radiation into a longer-wave secondary radiation in the green spectral range at a dominant wavelength of between approximately 490 nm and approximately 550 nm. This gives rise to mixed light composed of primary radiation and secondary radiation at a dominant wavelength of between approximately 460 nm and approximately 480 nm. The luminous flux of the mixed light is up to 130% greater than the luminous flux in the case of an optoelectronic component without a phosphor having the same dominant wavelength in the range between 460 nm and 480 nm, i.e., in the long-wave blue spectral range.

Preferably, the color loci of the mixed light composed of the primary radiation emitted by the semiconductor chip with a dominant wavelength of approximately 440 nm to approximately 455 nm and composed of secondary radiation emerging from the phosphor with a dominant wavelength of approximately 490 nm to approximately 550 nm lie in the CIE diagram (100) so close to one another that, given uniform phosphor concentration, the dominant wavelengths of the mixed light lie within a wavelength range of approximately 2 nm to 4 nm, in particular 3 nm. This is particularly advantageous since, as a result, the production distribution in the CIE color space with use of short-wave (440 nm to 455 nm) semiconductor chips sweeps over a smaller area than in the case of production of longer-wave semiconductor chips. This has the effect that upon combination of the entire production of short-wave blue-emitting semiconductor chips with the phosphor used, it is possible to produce a smaller dominant wavelength distribution than is possible in the case of the production of longer-wave blue-emitting semiconductor chips. Reduction of the dominant wavelength range of the semiconductor chips produced leads to a more uniform appearance of the radiation emitted by the optoelectronic components. Distribution of the dominant wavelengths can be reduced even further by the use of the phosphor. The phosphor can be excited all the more efficiently, the shorter the excitation wavelength. Overall, this has the consequence that a significantly greater proportion of chip production can be incorporated in an application. The chip yield rises and the costs fall.

Preferably, the color locus of the optoelectronic component which emits mixed light lies in the CIE diagram on the areas spanned by the different blue standards, in particular EN 12966 C1 (VMS) and EN 12966 C2 (VMS).

Preferably, the phosphor is distributed in the form of particles in a potting material. This is particularly advantageous since this can be achieved in the case of production by a particularly simple method. The production costs can thus be kept low. The phosphor is present in the potting material preferably in a concentration of less than 3 percent by weight. The phosphor concentration is particularly advantageously 1.5 percent by weight.

Preferably, the phosphor is arranged in a lamina that bears directly on the semiconductor chip. In other words, chip level conversion (CLC) is involved.

A lamina of this type can, for example, be produced spatially separately from the semiconductor body and then transferred to the radiation exit area thereof. The finished lamina can be positioned, for example, by a pick-and-place method on the radiation exit area of the semiconductor chip.

By way of example, the lamina can be produced by a printing method, for instance screen printing, on a film. For this purpose, particles of the phosphor are introduced into a matrix material. The matrix material with the phosphor particles is then printed onto a film. The matrix material is then generally cured. Particularly preferably, the matrix material of the lamina is silicone. However, it is also possible to use a different resin, for example, epoxy as the matrix material. The phosphor concentration within a lamina in which the phosphor is introduced into a material is particularly preferably 5% by weight to 50% by weight. Particularly preferably, the phosphor concentration within a lamina in which the phosphor is introduced into a matrix material is not more than 30% by weight, for example, approximately 25% by weight.

The thickness of the lamina in which the phosphor is introduced into a matrix material is particularly preferably 30 micrometers to 200 micrometers. Particularly preferably, the thickness of the lamina in which the phosphor is introduced into a matrix material is approximately 60 micrometers.

Furthermore, the lamina can also be a ceramic lamina. The ceramic lamina comprises a ceramic material or is produced from a ceramic material. In particular, the ceramic lamina comprises a ceramic phosphor.

The phosphor concentration within a ceramic lamina is preferably 10% by weight to 80% by weight. Particularly preferably, the phosphor concentration within a ceramic lamina is approximately 40% by weight.

The thickness of the ceramic lamina is particularly preferably 50 micrometers to 250 micrometers. Particularly preferably, the thickness of the ceramic lamina is approximately 100 micrometers.

The ceramic lamina, too, is likewise generally produced spatially separately from the semiconductor chip, in particular using a sintering process, and then applied to the radiation exit area of the semiconductor chip, for example, by a pick-and-place method.

Furthermore, the phosphor can also be deposited electrophoretically in a phosphor layer on the radiation exit area of the semiconductor chip. During electrophoretic deposition, particles of the phosphor and also the surface to be coated are introduced into an electrophoresis bath. The particles of the phosphor are then accelerated by an electric field such that a phosphor layer is deposited on the surface provided.

One characteristic of a phosphor layer deposited by electrophoresis is that generally at least all electrically conductive surfaces exposed to the electrophoresis bath are completely coated.

In general, the structure of an electrophoretically deposited phosphor layer is furthermore dependent on the conductivity of the surface on which the phosphor layer is applied. In general, the particles of an electrophoretically deposited phosphor layer are in direct contact with one another.

The phosphor concentration within an electrophoretically deposited phosphor layer is particularly preferably as high as possible and is ideally virtually approximately 100% by weight.

The thickness of the electrophoretically deposited phosphor layer is particularly preferably 5 micrometers to 50 micrometers. Particularly preferably, the thickness of the electrophoretically deposited phosphor layer is approximately 10 micrometers.

Particularly preferably, an electrophoretically deposited phosphor layer is fixed by a binder after the electrophoresis method. The binder can, for example, contain one of the following materials or be formed from one of the following materials: epoxy, silicone, spin-on glass.

Preferably, the phosphor is arranged at or in an exit window which terminates the optoelectronic component around the semiconductor chip.

The exit window is generally provided to serve as a radiation exit window of the optoelectronic component. Particularly preferably, the exit window is arranged in the beam path of the semiconductor chip. Preferably, a large part of the radiation emitted by the semiconductor chip passes through the exit window. The exit window can be plate-shaped. Furthermore, it is also possible for the exit window to be a hollow body or curved. The exit window can also be an optical element, for example, a lens.

The thickness of the exit window is particularly preferably 100 micrometers to 500 micrometers. By way of example, the thickness of the exit window is approximately 300 micrometers.

The phosphor may be introduced into the exit window. By way of example, the exit window is formed from a matrix material such as a thermoplastic, for example, wherein the phosphor is introduced in particle form into the matrix material.

The phosphor concentration within the window is preferably 2% by weight to 10% by weight. By way of example, the phosphor concentration within the exit window is approximately 4% by weight.

Furthermore, the phosphor can also be arranged at the exit window. By way of example, the phosphor can be applied in the form of a phosphor layer on the exit window. The phosphor layer can be applied by electrophoresis or sputtering on the exit window. It is also possible to apply a lamina already described above or a phosphor film to the exit window, for example, by adhesive bonding.

Our optoelectronic components may contain a phosphor comprising a europium-activated blue-green silicate, in particular a chlorosilicate. The phosphor is known from DE 10 026 435 A1. The chlorosilicate phosphor has a doping with manganese besides the doping with europium. The empirical formula $Ca_{8-x-y}Eu_xMn_yMg(SiO_4)_4Cl_2$, where $y \geq 0.03$ holds true. The proportion of europium is between $x=0.005$ and $x=1.5$. The proportion of manganese is between $y=0.03$ and $y=1.0$. The dominant wavelength of the longer-wave secondary radiation that emerges from the above phosphor is in the green spectral range at wavelengths of between 490 nm and 540 nm. The disclosure of DE 10 026 435 A1 is hereby incorporated by reference.

The phosphor of our optoelectronic component may comprise europium-activated orthosilicates. The empirical formula $(Ca,Sr,Ba)_2SiO_4:EU$ holds true. The dominant wavelength of the longer-wave secondary radiation that emerges from the above phosphor lies in the green spectral range at greater than 518 nm.

The phosphor of our optoelectronic components may comprise europium-activated thiogallates. The empirical formula $(Mg,Ca,Sr,Ba)Ga_2S_4:EU$ holds true. The dominant wavelength of the longer-wave secondary radiation that emerges from the above phosphor lies in the green spectral range.

The phosphor of our optoelectronic components may comprise europium-activated SiONs. The empirical formula $Ba_3Si_6O_{12}N_2:EU$ holds true. The dominant wavelength of the longer-wave secondary radiation that emerges from the above phosphor lies in the green spectral range at approximately 540 nm.

The phosphor of our optoelectronic components may comprise beta-SiAlON. The dominant wavelength of the longer-wave secondary radiation that emerges from the above phosphor lies in the green spectral range.

The phosphor of our optoelectronic components may comprise an arbitrary combination of the above phosphor types.

Preferably, the phosphors have a quantum efficiency of up to 70%. This is particularly advantageous since, as a result, only a small part of the primary radiation is converted into disturbing heat by interaction with the phosphor.

Elements that are identical, of identical type or act identically are provided with the same reference signs in the Drawings. The Drawings and the size relationships of the elements illustrated therein among one another shall not be regarded as to scale. Rather, individual elements may be illustrated with an exaggerated size or size reduction to enable better illustration and to afford a better understanding.

FIG. 1A shows an optoelectronic component 1000 with volume conversion. The optoelectronic component comprises a semiconductor chip 40. The semiconductor chip 40 can be based on a III-V compound semiconductor material. The semiconductor chip 40 has at least one active zone that emits electromagnetic radiation. The active zones can be pn-junctions, a double heterostructure, a multiple quantum well structure (MQW), a single quantum well structure (SQW). Quantum well structure means, quantum wells (3-dim), quantum wires (2-dim) and quantum dots (1-dim). The semiconductor chip 40 can be designed, for example, as a surface emitter, in particular as a so-called "thin-film" chip, as a volume emitter, in particular as a sapphire volume emitter, or as a so-called "UX-3" chip (product designation of OSRAM).

The thin-film chip is known from WO 2005081319 A1, for example. If, during production of the optoelectronic component, in particular of a component comprising a metal-containing mirror layer, the growth substrate of the semiconductor layer sequence is detached, then such components produced with detachment of the growth substrate are also designated as thin-film components. The radiation-emitting semiconductor component herein comprises a stack of different III-V nitride semiconductor layers, in particular gallium nitride layers. The thin-film component is without a radiation-absorbing substrate and a reflector is applied directly on the GaN semiconductor body composed of the stack of different III-V nitride semiconductor layers.

The sapphire volume emitter is known from DE 10 2006 015 788 A1, for example. In this case, sapphire can be used as a growth substrate for the semiconductor layer sequence. In contrast to the thin-film chip, in the case of the sapphire volume emitter, the growth substrate is not detached from the semiconductor layer sequence at the end of the production process. The (growth) substrate is radiation-transmissive to the radiation generated in the active zone. This facilitates the coupling-out of radiation from the semiconductor chip through the substrate. The semiconductor chip is therefore a volume emitter. In the case of a volume emitter, in contrast to a surface emitter, a crucial proportion of radiation is coupled out from the semiconductor chip via the substrate as well. The surface luminance at the coupling-out areas of the semiconductor chip is reduced in the case of a volume emitter by comparison with a surface emitter.

The UX-3 chip is known from DE 10 2007 022 947 A1 which describes an optoelectronic semiconductor body comprising a semiconductor layer sequence having an active layer, a first and a second electrical connection layer. The semiconductor body is provided to emit electromagnetic radiation from a front side. First and second electrical connection layers are arranged at a rear side situated opposite the front side. They are electrically insulated from one another by an isolating layer. The first electrical connection layer, the second electrical connection layer and the isolating layer can overlap laterally. A partial region of the second electrical connection layer extends from the rear side through a perforation of the active layer in the direction toward the front side. What is advantageous about the UX-3 chip is that, in contrast to the thin-film chip, metal is no longer arranged at the front side of the semiconductor layer sequence. Absorption losses are avoided as a result.

The disclosures of WO 2005081319 A1, DE 10 2006 015 788 A1 and DE 10 2007 022 947 A1 are hereby incorporated by reference.

The semiconductor chip 40 having an emission wavelength in the blue spectral range is arranged on a carrier 41 and contact is made with it by a bonding wire 42. The carrier 41 can be by way of example a so-called "premold leadframe." Premold means that the mold is injected on.

In an example not shown, a plurality of semiconductor chips 40 are arranged in the optoelectronic component.

The phosphor 44 is distributed in the form of particles homogeneously in a potting material 43. The simulation in FIGS. 3a and 3b and the measurements in FIGS. 4a, 4b, 5a, 5b and 5c are based on an optoelectronic component having a homogenous distribution of the phosphor 44 in the potting material 43.

In an example not shown, the phosphor can be partly or completely sedimented. As a result of the sedimentation, a continuous phosphor layer forms at the bottom of the optoelectronic component, the phosphor layer also covering the semiconductor chip, inter alia. No simulations or measurements are shown in this respect.

Figure 1B:
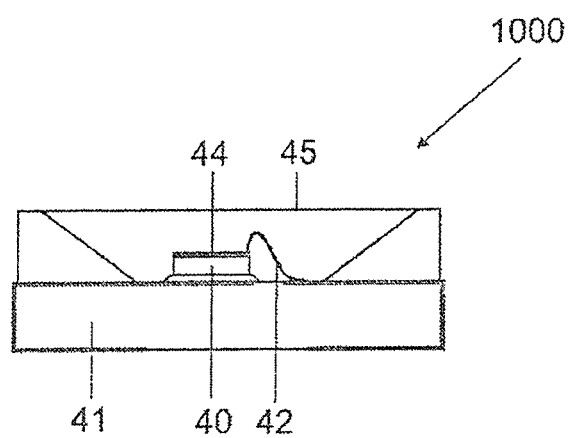
FIG. 1B shows an optoelectronic component with near-chip conversion.

FIG. 1B shows an optoelectronic component 1000 with near-chip conversion, which is designated as chip level conversion (CLC). In contrast to FIG. 1A, the phosphor 44 is arranged in the form of a lamina directly on the semiconductor chip 40. The carrier 41 is a premold leadframe. In an example not shown, instead of the phosphor lamina, a phosphor layer can be deposited electrophoretically. The layer also covers, inter alia, the semiconductor chip 40 and the leadframe 41. No simulations or measurements are shown in this respect.

Figure 1C:
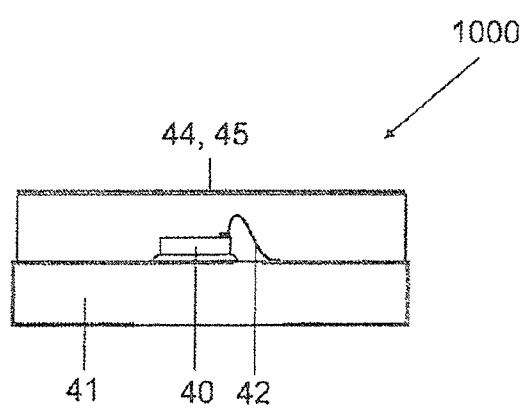
FIG. 1C shows an optoelectronic component with conversion at or in the exit window.

FIG. 1C shows an optoelectronic component 1000 with conversion at the exit window 45. By way of example, a ceramic is suitable as a leadframe. In contrast to FIGS. 1A and 1B, the phosphor is arranged in the exit window 45 or at the surface of the exit window 45, which is designated as remote phosphor. The exit window is arranged in a planar fashion. In an example not shown, the exit window is in a hollow shape or a dome-shaped. The exit window is coated with phosphor at its inner side. The phosphor can be deposited electrophoretically. No simulations or measurements are shown in this respect.

Figure 2A:
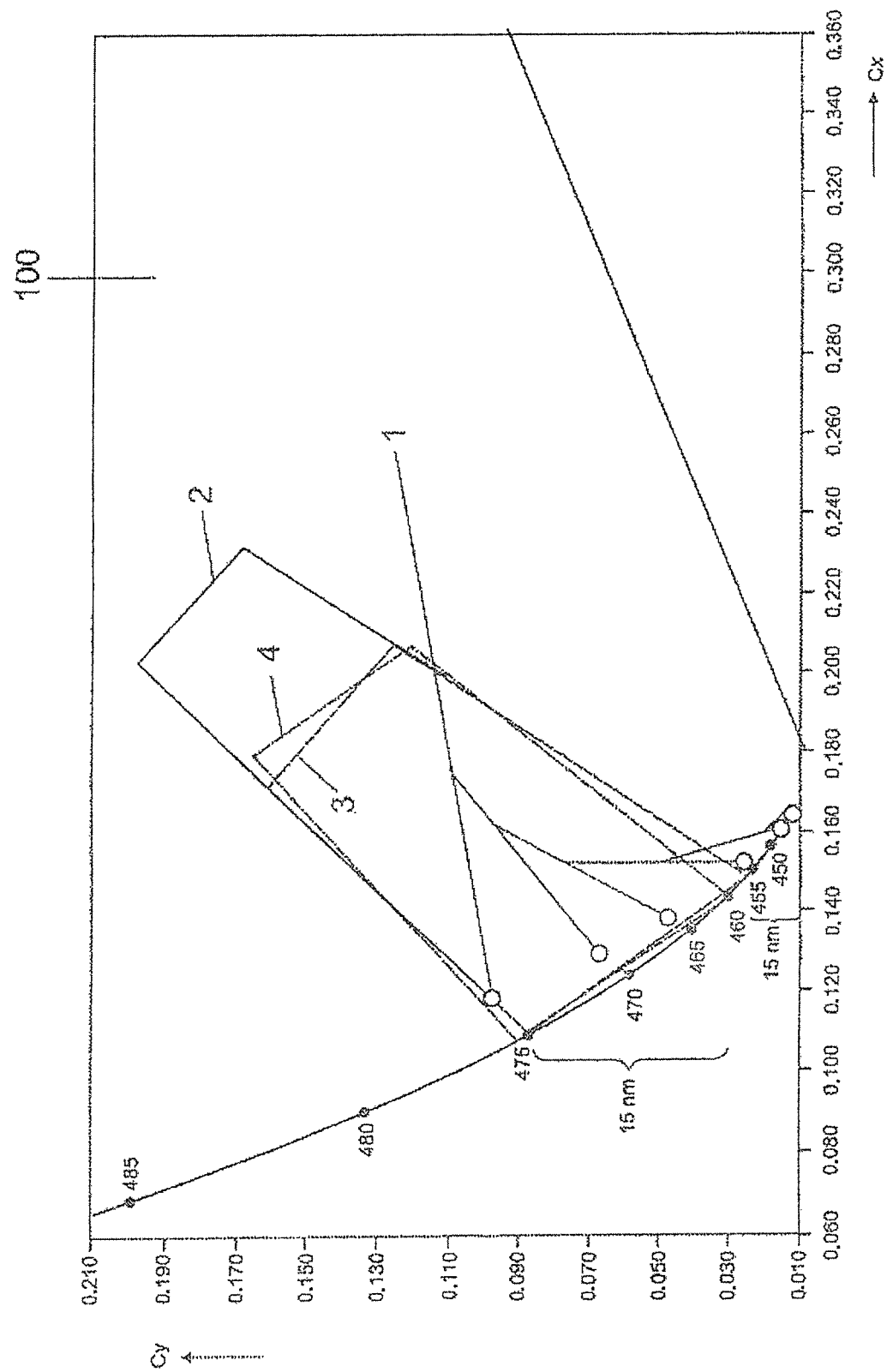
FIG. 2A shows a simulated reference situation with the position of color loci of various blue-emitting semiconductor chips in the CIE diagram.

FIG. 2A shows an excerpt 100 from the color space in accordance with the CIE standard chromaticity system. A reference situation is illustrated. Blue-emitting semiconductor chips emit electromagnetic radiation having dominant wavelengths at 440 nm, 445 nm, 455 nm, 465 nm, 470 nm or 475 nm. The color loci 1 of the blue-emitting semiconductor chips are entered in the CIE diagram. Only the semiconductor chips having dominant wavelengths at 465 nm, 470 nm and 475 nm lie within the areas 2, 3, 4 spanned by the blue standards EN 12966 C1, 12966 C2 and Rus Rail. The semiconductor chips lying outside the blue standards and having dominant wavelengths at 440 nm, 445 nm, 455 nm cannot be used per se for lighting purposes. In other words, applications cannot accept the entire production range of the semiconductor chips. The color loci of the semiconductor chips are close to the envelope of the color space 100, which dictates a very high color saturation, in particular greater than 90%.

FIG. 2B shows in a tabular fashion a simulation of the brightnesses and of the color loci of the blue-emitting semiconductor chips from FIG. 2A. No phosphor is used. The table presents peak wavelengths, dominant wavelengths, loci of the semiconductor chips 1 in the color space on the basis of the coordinates Cx and Cy, luminous flux, radiation power, luminous flux ratio normalized to the luminous flux at the dominant wavelength of 470 nm and the radiation power ratio normalized to the radiation power at the dominant wavelength of 470 nm. The radiation power decreases continuously as the wavelength increases, whereas the luminous flux, i.e., the radiation power weighted with the V(λ) curve, increases continuously as the wavelength increases. The V(λ) curve describes the sensitivity of the human eye in the wavelength range of 380 nm to 780 nm. The maximum of V(λ) is approximately 550 nm, that is to say in the green spectral range. The peak wavelength is the wavelength at which the electromagnetic spectrum has a maximum. The dominant wavelength results from the weighting of a non-monochromatic spectrum with the sensitivity of the human eye. The radiation power is the energy emitted by a light source into the space. The unit of radiation power is the watt. The luminous flux is proportional to the radiation power weighted with the V(λ) curve. The unit of luminous flux is the lumen.

Figure 3A:
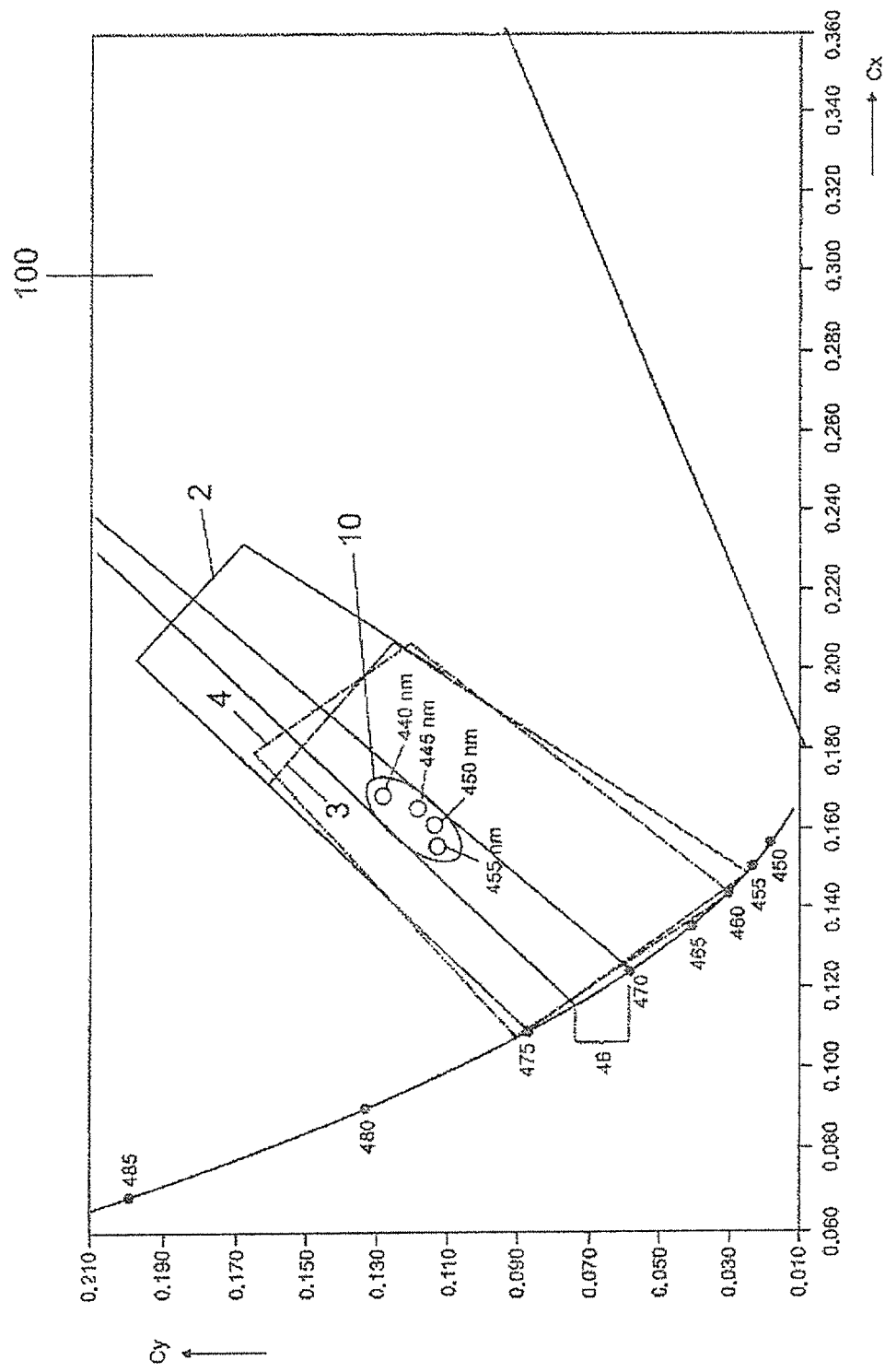
FIG. 3A shows a simulated situation with the position of color loci of various blue-emitting semiconductor chips in the CIE diagram after a wavelength conversion.

FIG. 3A shows a simulated situation with the position of color loci 10 of various blue-emitting semiconductor chips in the CIE diagram after wavelength conversion. Color loci for semiconductor chips having dominant wavelengths at 440 nm, 445 nm, 450 nm and 455 nm are illustrated. The phosphor is present in a concentration of 1.5% in the volume of the potting material. The primary radiation emitted by the semiconductor chip 40 therefore lies in the short-wave blue spectral range at a dominant wavelength of less than approximately 455 nm. The phosphor particles convert at least part of the primary radiation into a longer-wave secondary radiation in the green spectral range at a dominant wavelength of between approximately 490 nm and approximately 550 nm. The mixed light composed of primary radiation and secondary radiation has a dominant wavelength at wavelengths of approximately 460 nm to approximately 480 nm. The luminous flux of the mixed light is up to 130% greater than the luminous flux in the case of an optoelectronic component without a phosphor 44 having the same dominant wavelength of 460 nm to 480 nm.

The color loci of the mixed light composed of the primary radiation emitted by the semiconductor chip 40 with a dominant wavelength of approximately 440 nm to approximately 455 nm and composed of secondary radiation emerging from the phosphor 44 with a dominant wavelength of approximately 490 nm to approximately 550 nm lie in the CIE diagram (100) so close to one another that, given uniform phosphor concentration, the dominant wavelengths of the mixed light lie within a projected dominant wavelength range 46 of approximately 2 nm to 4 nm, in particular 3 nm. In this case, the color loci of the optoelectronic components are projected onto the envelope of the CIE color space.

The color locus of the optoelectronic component (1000) which emits mixed light lies in the CIE diagram on the areas spanned by the different blue standards, in particular EN 12966 C1 (VMS) and EN 12966 C2 (VMS). The color saturation is approximately 70%, which is a value sufficient for perception by the human eye.

FIG. 3B shows in a tabular fashion results of the simulation from FIG. 3A. The phosphor 44 is provided as particles distributed in a potting 43 and is present in a concentration of 1.5 percent by weight. The luminous flux ratio is once again normalized to the luminous flux at 470 nm without a phosphor. The value for the luminous flux at 470 nm is 5.18 (see FIG. 2B). For the dominant wavelength of 455 nm, the increase in the luminous flux is 66%. For the dominant wavelength of 440 nm, the increase in the luminous flux is equal to 80%.

Figure 4A:
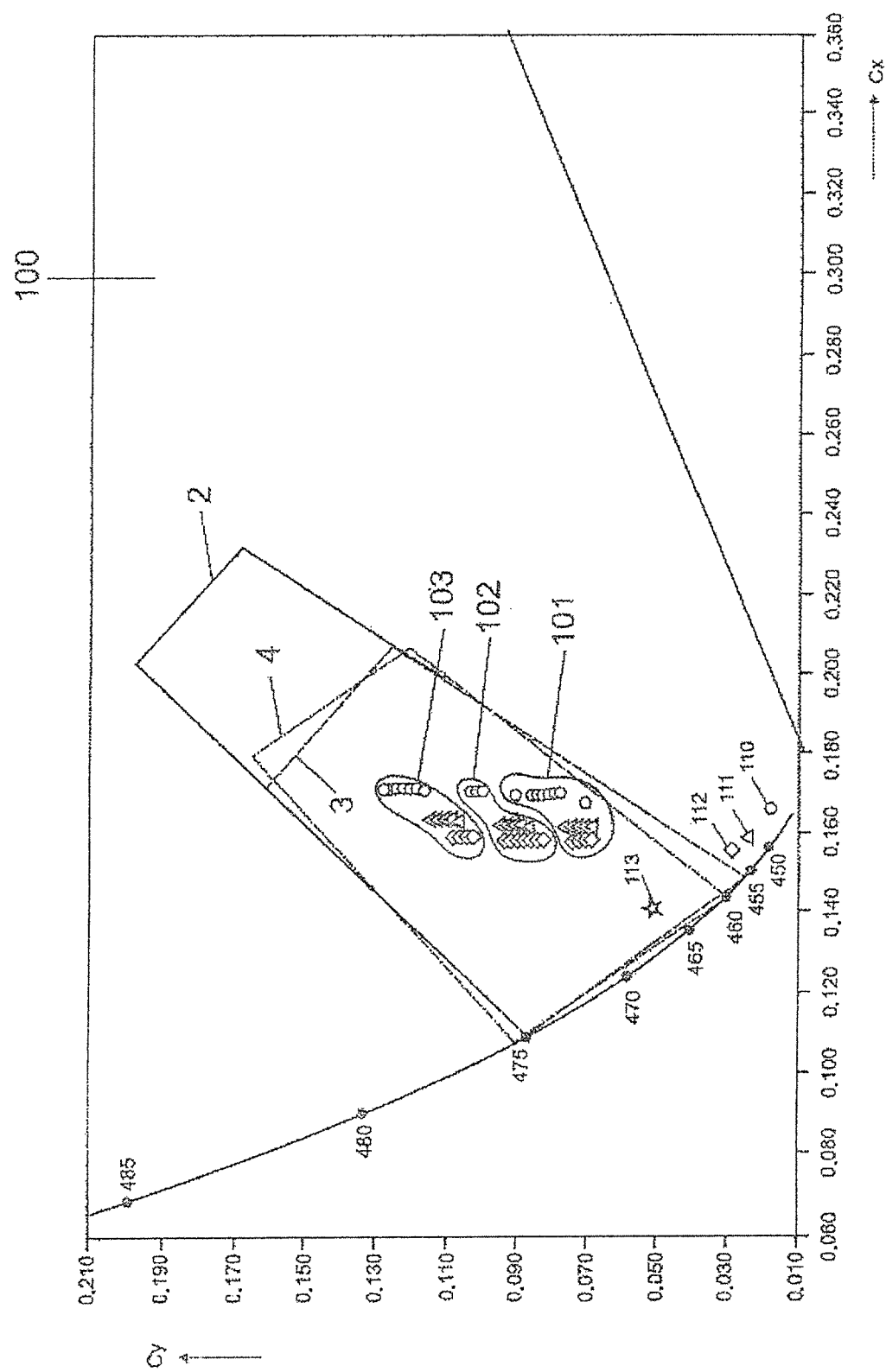
FIG. 4A shows measured color loci of blue-emitting semiconductor chips after a wavelength conversion for various phosphor concentrations.

FIG. 4A shows measured color loci of blue-emitting semiconductor chips after wavelength conversion for various phosphor concentrations.

The color locus 110 of a semiconductor chip having a dominant wavelength of 441 nm, the color locus 111 of a semiconductor chip having a dominant wavelength of 451 nm, the color locus 112 of a semiconductor chip having a dominant wavelength of 454 nm and the color locus 113 of a semiconductor chip having a dominant wavelength of 465.5 nm are plotted as reference. No phosphor is used. The color loci 110, 111 and 112 lie outside the valid blue standards.

The color loci for the semiconductor chips at a phosphor concentration of 1% 101, 1.5% 102 and 2% 103 are illustrated. Despite the semiconductor chip wavelength used from a range of approximately 15 nm (441 nm to 454 nm), the dominant wavelengths of the optoelectronic components at a uniform phosphor concentration advantageously lie in the range of approximately 2 nm. The drawing depicts, inter alia, lines which meet the envelope of the CIE color space. Color loci which lie on the same line have the same dominant wavelength.

FIG. 4B shows in a tabular fashion measured values concerning FIG. 4A. In the first section of the table, the coordinates Cx and Cy in the CIE color space are indicated for the dominant wavelengths of the semiconductor chips at 441 nm, 451 nm and 454 nm. The color locus 113 of the semiconductor chip having a dominant wavelength of 465.5 nm serves as reference. In the second section of the table, measured values for the optoelectronic components, that is to say for the combination of semiconductor chip and phosphor, are indicated. Phosphor concentrations, the dominant wavelengths, coordinates of the optoelectronic components in the CIE color space and intensities of the luminous flux generated via the optoelectronic components are related to one another. In addition, the radiation power of the optoelectronic components is indicated. The luminous flux ratio is indicated in the third section of the table. For this purpose, the luminous fluxes of the optoelectronic components are normalized to the luminous flux of a semiconductor chip having a dominant wavelength of 465.5 nm without the use of a phosphor. The luminous flux to which normalization is effected is 22.8 lumens.

The situation with optoelectronic components with a phosphor concentration of 1.5% shall be explained by way of example. The dominant wavelength of the first semiconductor chip is 441 nm, and the associated dominant wavelength of the optoelectronic component, that is to say of the combination of semiconductor chip and phosphor, is 466.7 nm. The luminous flux is 40.4 lumens. The luminous flux ratio is 177%. This means that the luminous flux is 77% greater than in the case of the semiconductor chip having a dominant wavelength of 465.5 nm and without a phosphor. The dominant wavelength of the second semiconductor chip is 451 nm, and the associated dominant wavelength of the optoelectronic component, that is to say of the combination of semiconductor chip and phosphor, is 467.1 nm. The luminous flux is 39.9 lumens. The luminous flux ratio is 175%. This means that the luminous flux is 75% greater than in the case of the semiconductor chip having a dominant wavelength of 465.5 nm and without a phosphor. The dominant wavelength of the third semiconductor chip is 454 nm, and the associated dominant wavelength of the opto-electronic component, that is to say of the combination of semiconductor chip and phosphor is 467.5 nm. The luminous flux is 38.1 lumens. The luminous flux ratio is 167%. This means that the luminous flux is 67% greater than in the case of the semiconductor chip having a dominant wavelength of 465.5 nm and without a phosphor. The gain in brightness as a result of using the phosphor in a concentration of 1.5% in the volume potting over the semiconductor chip is accordingly between 67% and 77% at a dominant wavelength in the range of 466 nm to 468 nm.

Figure 5A:
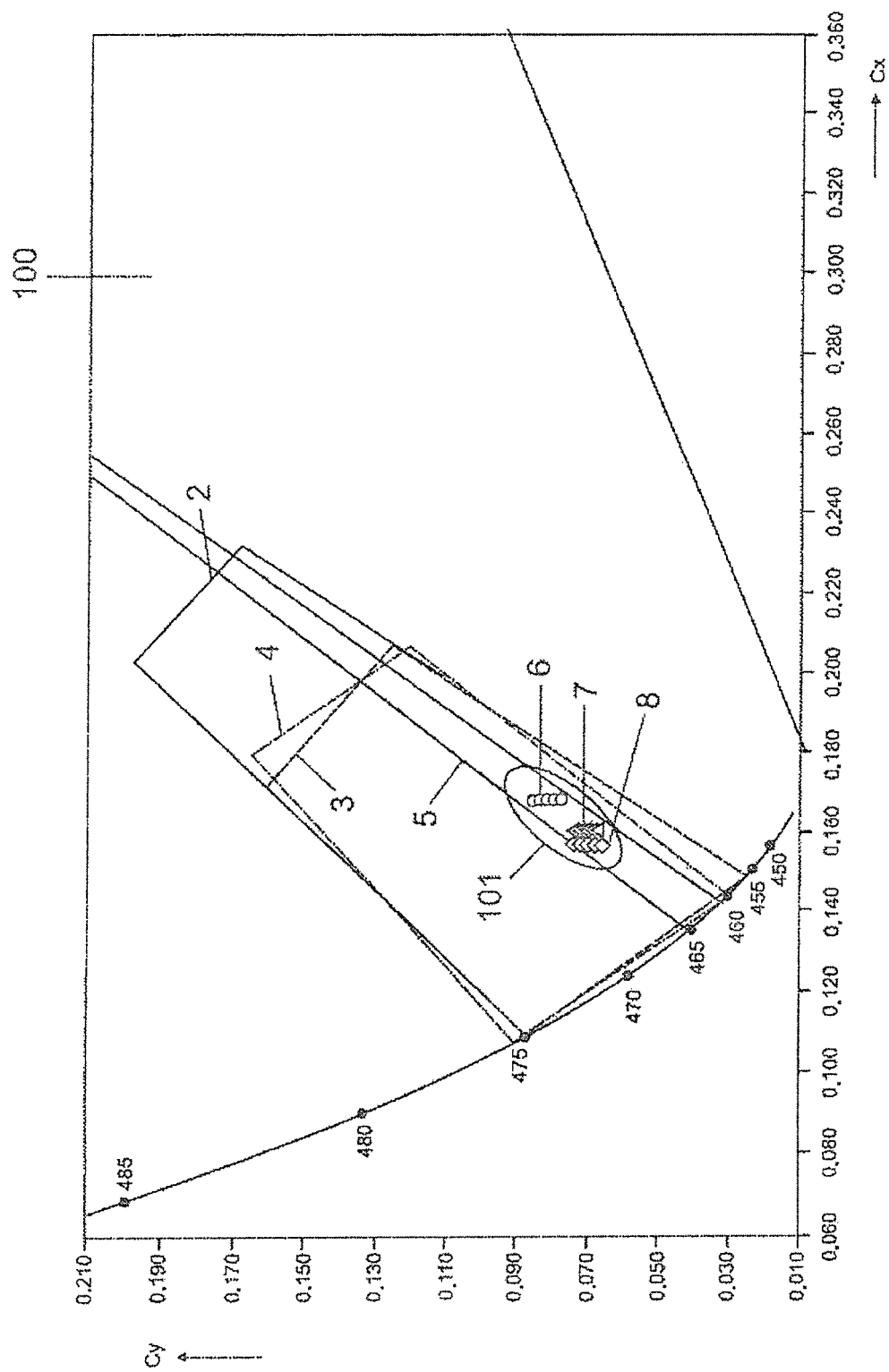
FIG. 5A shows measured color loci of blue-emitting semiconductor chips at a phosphor concentration of 1%.

FIG. 5A shows a partial region of FIG. 4A. The measured color loci of blue-emitting semiconductor chips 101 at a phosphor concentration of 1% are plotted. The areas 2, 3, 4 of the abovementioned blue standards are depicted. The entire dominant wavelength range 5 of the optoelectronic components at a phosphor concentration of 1% is plotted in the form of a segment. The color loci 6 for a chip wavelength of 441 nm, the color loci 7 for a chip wavelength of 451 nm and the color loci 8 for a chip wavelength of 454 nm are plotted. The dominant wavelength range of the optoelectronic components lies between 461 nm and 465 nm. In accordance with FIG. 4B, the luminous flux or, in other words, the brightness of the optoelectronic components lies between 32 lumens and 34 lumens given an electric current of 350 mA.

Figure 5B:
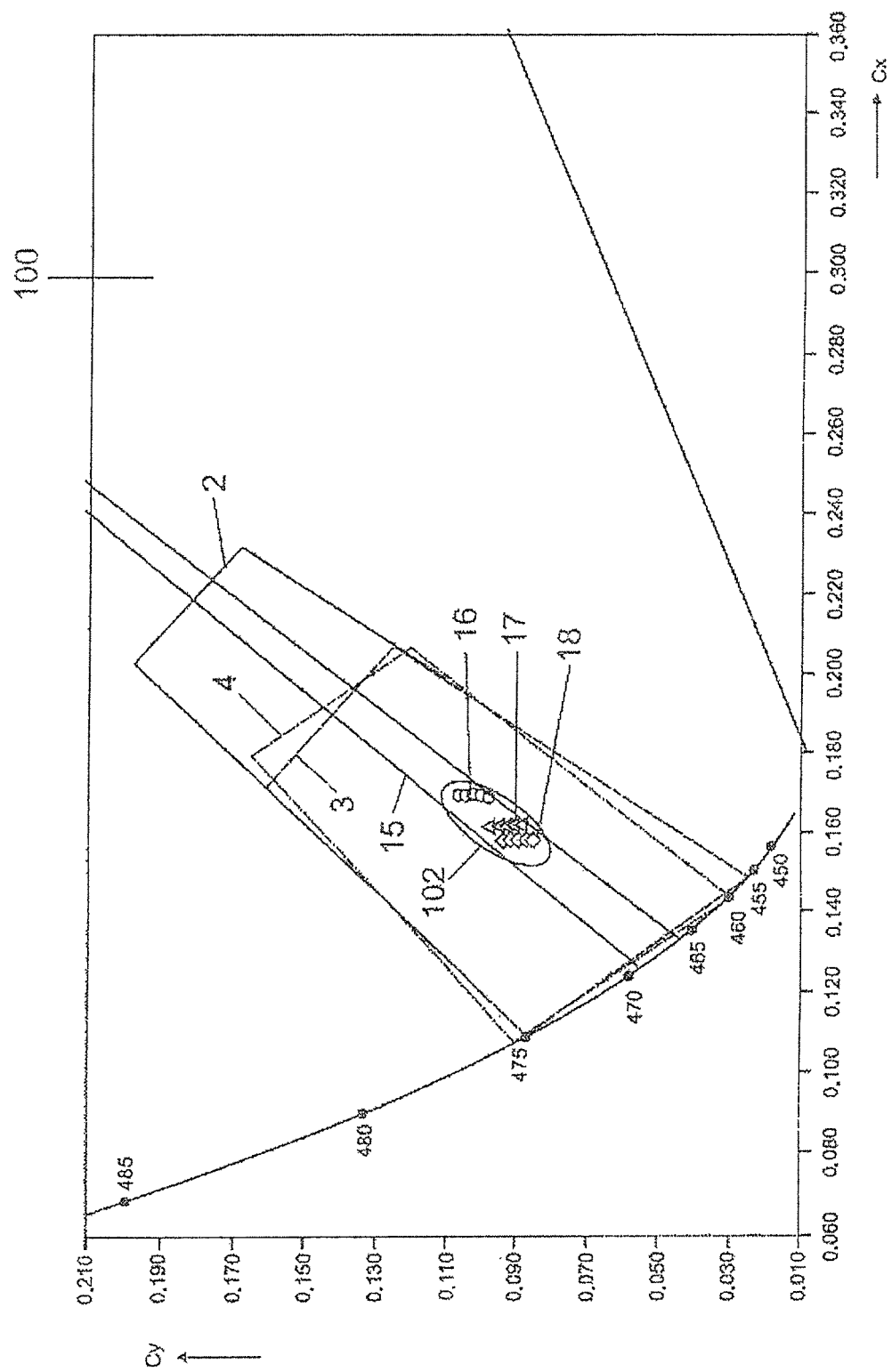
FIG. 5B shows measured color loci of blue-emitting semiconductor chips at a phosphor concentration of 1.5%.

FIG. 5B shows a partial region of FIG. 4A. The measured color loci of blue-emitting semiconductor chips 102 at a phosphor concentration of 1.5% are plotted. The areas 2, 3, 4 of the blue standards are depicted. The entire dominant wavelength range 15 of the optoelectronic components at a phosphor concentration of 1.5% is plotted in the form of a segment. The color loci 16 for a chip wavelength of 441 nm, the color loci 17 for a chip wavelength of 451 nm and the color loci 18 for a chip wavelength of 454 nm are plotted. The dominant wavelength range of the optoelectronic components lies between 466 nm and 469 nm. In accordance with FIG. 4B, the luminous flux or, in other words, the brightness of the optoelectronic components lies between 38 lumens and 41 lumens given an electric current of 350 mA.

Figure 5C:
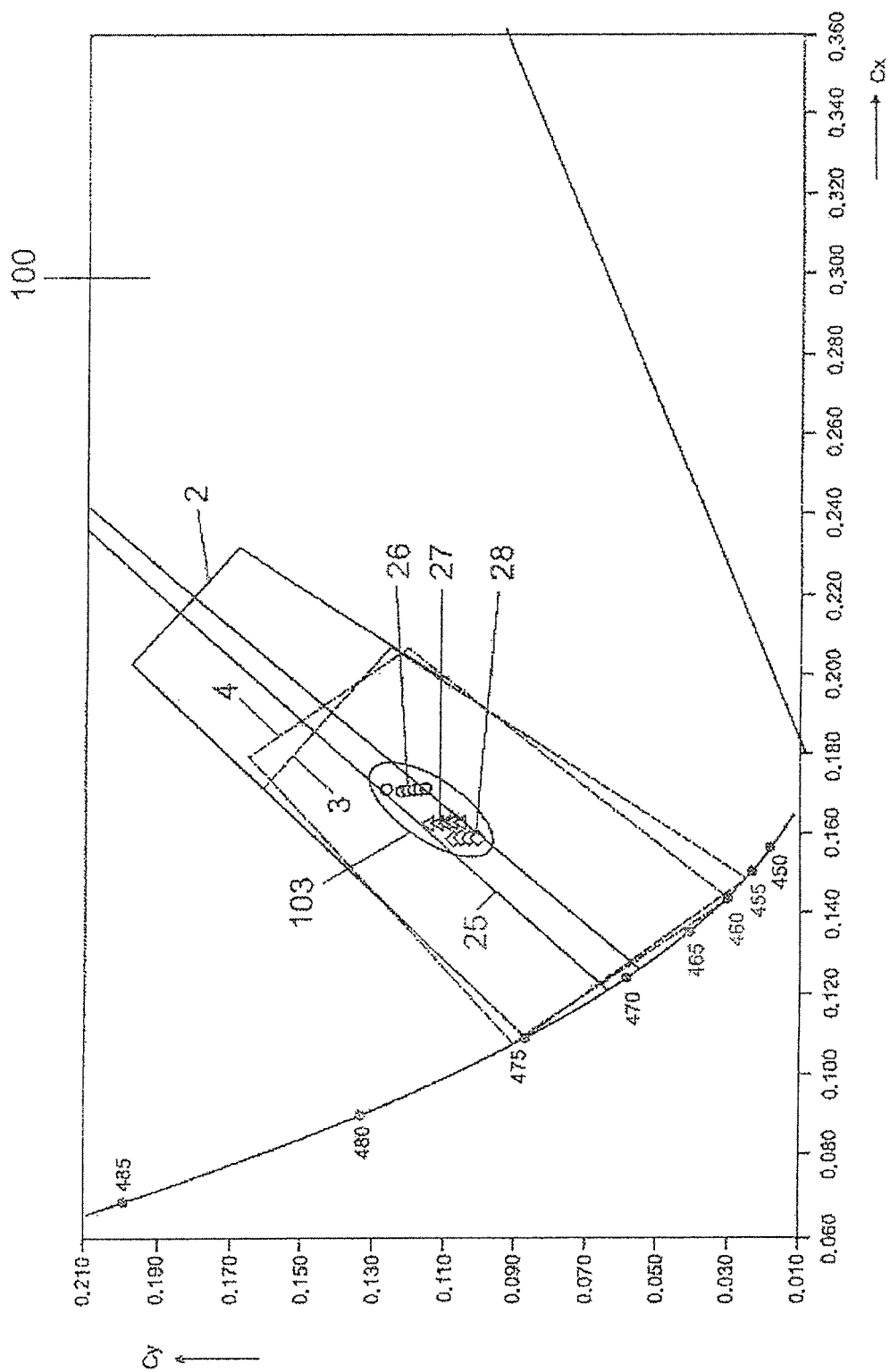
FIG. 5C shows measured color loci of blue-emitting semiconductor chips at a phosphor concentration of 2%.

FIG. 5C shows a partial region of FIG. 4A. The measured color loci of blue-emitting semiconductor chips 103 at a phosphor concentration of 2% are plotted. The areas 2, 3, 4 of the blue standards are depicted. The entire dominant wavelength range 25 of the optoelectronic components at a phosphor concentration of 2% is plotted in the form of a segment. The color loci 26 for a chip wavelength of 441 nm, the color loci 27 for a chip wavelength of 451 nm and the color loci 28 for a chip wavelength of 454 nm are plotted. The dominant wavelength range of the optoelectronic components lies between 469 nm and 471 nm. In accordance with FIG. 4B, the luminous flux or, in other words, the brightness of the optoelectronic components lies between 42 lumens and 46 lumens given an electric current of 350 mA.

The optoelectronic component has been described on the basis of several examples. In this case, the examples are not restricted to specific combinations or features. Even if some features and configurations have been described only in connection with a particular example or individual examples, they can in each case be combined with other features from other examples. It is likewise possible to omit or add individual illustrated features or particular configurations in examples, provided that the general technical teaching continues to be realized.

The invention claimed is:

1. An optoelectronic component comprising:
a semiconductor chip that emits a primary radiation in the short-wave blue spectral range at a dominant wavelength of less than approximately 465 nm; and
a phosphor that converts at least part of the primary radiation into a longer-wave secondary radiation in the green spectral range at a dominant wavelength of between approximately 490 nm and approximately 550 nm and at least partly surrounds the semiconductor chip,
wherein
a mixed light composed of primary radiation and secondary radiation has a dominant wavelength at wavelengths of approximately 460 nm to approximately 480 nm such that a luminous flux of the mixed light is up to 130% greater than a luminous flux in an optoelectronic component without a phosphor having the same dominant wavelength in a range of 460 nm to 480 nm,
the phosphor is arranged in a lamina that bears directly on the semiconductor chip,
the lamina comprises a matrix material into which the phosphor is introduced with a concentration of 5% by weight to 50% by weight, and
the lamina has a thickness of 30 micrometers to 200 micrometers.

2. The optoelectronic component according to claim 1, wherein the lamina is ceramic and has a phosphor concentration of 10% by weight to 80% by weight.

3. The optoelectronic component according to claim 1, wherein the color loci of the mixed light composed of the primary radiation emitted by the semiconductor chip with a dominant wavelength of approximately 440 nm to approximately 455 nm and composed of secondary radiation emerging from the phosphor with a dominant wavelength of approximately 490 nm to approximately 550 nm lie in the CIE diagram so close to one another that, given uniform phosphor concentration, the dominant wavelengths of the mixed light lie within a wavelength range of approximately 2 to 4 nm.

4. The optoelectronic component according to claim 3, wherein the color locus of the optoelectronic component that emits mixed light lies in the CIE diagram on the areas spanned by different blue standards EN 12966 C1 (VMS) and EN 12966 C2 (VMS).

5. The optoelectronic component according to claim 1, wherein the phosphor comprises one of: an europium-activated blue-green silicate which is a chlorosilicate having empirical formula $Ca_{8-x-y}Eu_xMn_yMg(SiO_4)_4Cl_2$, wherein $y \geq 0.03$ and $x=0.005$ and $x=1.5$, an europium-activated orthosilicate having empirical formula $(Ca,Sr,Ba)_2SiO_4:EU$, an europium-activated thiogallate having empirical formula $(Mg,Ca,Sr,Ba)Ga_2S_4:EU$, an europium-activated SiON having empirical formula $Ba_3Si_6O_{12}N_2:EU$, and a beta-SiAlON.

6. The optoelectronic component according to claim 1, wherein the phosphor has a quantum efficiency of up to 70%.

7. An optoelectronic component comprising:
a semiconductor chip that emits a primary radiation in the short-wave blue spectral range at a dominant wavelength of less than approximately 465 nm; and
a phosphor that converts at least part of the primary radiation into a longer-wave secondary radiation in the green spectral range at a dominant wavelength of between approximately 490 nm and approximately 550 nm and at least partly surrounds the semiconductor chip,
wherein
a mixed light composed of primary radiation and secondary radiation has a dominant wavelength at wavelengths of approximately 460 nm to approximately 480 nm such that a luminous flux of the mixed light is up to 130% greater than a luminous flux in an optoelectronic component without a phosphor having the same dominant wavelength in a range of 460 nm to 480 nm, and the phosphor is comprised of an electrophoretically deposited phosphor layer applied on a radiation exit area of the semiconductor chip, said phosphor layer having a thickness of 5 micrometers to 50 micrometers.

8. The optoelectronic component according to claim 7, wherein the color loci of the mixed light composed of the primary radiation emitted by the semiconductor chip with a dominant wavelength of approximately 440 nm to approximately 455 nm and composed of secondary radiation emerging from the phosphor with a dominant wavelength of approximately 490 nm to approximately 550 nm lie in the CIE diagram so close to one another that, given uniform phosphor concentration, the dominant wavelengths of the mixed light lie within a wavelength range of approximately 2 to 4 nm.

9. The optoelectronic component according to claim 8, wherein the color locus of the optoelectronic component that emits mixed light lies in the CIE diagram on the areas spanned by different blue standards EN 12966 C1 (VMS) and EN 12966 C2 (VMS).

10. The optoelectronic component according to claim 7, wherein the phosphor comprises one of: an europium-activated blue-green silicate which is a chlorosilicate having empirical formula $Ca_{8-x-y}Eu_xMn_yMg(SiO_4)_4Cl_2$, wherein y≥0.03 and x=0.005 and x=1.5, an europium-activated orthosilicate having empirical formula $(Ca,Sr,Ba)_2SiO_4$:EU, an europium-activated thiogallate having empirical formula $(Mg,Ca,Sr,Ba)Ga_2S_4$:EU, an europium-activated SiON having empirical formula $Ba_3Si_6O_{12}N_2$:EU, and a beta-SiAlON.

11. The optoelectronic component according to claim 7, wherein the phosphor has a quantum efficiency of up to 70%.

12. The optoelectronic component according to claim 7, wherein the phosphor concentration within the electrophoretically deposited phosphor layer is approximately 100% by weight.

13. An optoelectronic component comprising:
a semiconductor chip that emits a primary radiation in the short-wave blue spectral range at a dominant wavelength of less than approximately 465 nm; and
a phosphor that converts at least part of the primary radiation into a longer-wave secondary radiation in the green spectral range at a dominant wavelength of between approximately 490 nm and approximately 550 nm and at least partly surrounds the semiconductor chip, wherein
a mixed light composed of primary radiation and secondary radiation has a dominant wavelength at wavelengths of approximately 460 nm to approximately 480 nm such that a luminous flux of the mixed light is up to 130% greater than a luminous flux in an optoelectronic component without a phosphor having the same dominant wavelength in a range of 460 nm to 480 nm, and the phosphor is arranged at and/or in an exit window terminating the optoelectronic component around the semiconductor chip, and the phosphor concentration in the exit window is 2% by weight to 10% by weight.

14. The optoelectronic component according to claim 13, wherein the color loci of the mixed light composed of the primary radiation emitted by the semiconductor chip with a dominant wavelength of approximately 440 nm to approximately 455 nm and composed of secondary radiation emerging from the phosphor with a dominant wavelength of approximately 490 nm to approximately 550 nm lie in the CIE diagram so close to one another that, given uniform phosphor concentration, the dominant wavelengths of the mixed light lie within a wavelength range of approximately 2 to 4 nm.

15. The optoelectronic component according to claim 14, wherein the color locus of the optoelectronic component that emits mixed light lies in the CIE diagram on the areas spanned by different blue standards EN 12966 C1 (VMS) and EN 12966 C2 (VMS).

16. The optoelectronic component according to claim 13, wherein the phosphor comprises one of: an europium-activated blue-green silicate which is a chlorosilicate having empirical formula $Ca_{8-x-y}Eu_xMn_yMg(SiO_4)_4Cl_2$, wherein y≥0.03 and x=0.005 and x=1.5, an europium-activated orthosilicate having empirical formula $(Ca,Sr,Ba)_2SiO_4$:EU, an europium-activated thiogallate having empirical formula $(Mg,Ca,Sr,Ba)Ga_2S_4$:EU, an europium-activated SiON having empirical formula $Ba_3Si_6O_{12}N_2$:EU, and a beta-SiAlON.

17. The optoelectronic component according to claim 13, wherein the phosphor has a quantum efficiency of up to 70%.

* * * * *